United States Patent [19]
Ha et al.

[11] Patent Number: 6,037,243
[45] Date of Patent: Mar. 14, 2000

[54] METHOD FOR MANUFACTURING SILICON NANOMETER STRUCTURE USING SILICON NITRIDE FILM

[75] Inventors: Jeong Sook Ha; Kang Ho Park, both of Daejon-shi, Rep. of Korea

[73] Assignee: Electronics and Telecommunications Research Institute, Daejon, Rep. of Korea

[21] Appl. No.: 09/138,114

[22] Filed: Aug. 21, 1998

[30] Foreign Application Priority Data

Nov. 6, 1997 [KR]  Rep. of Korea ...................... 97-58523

[51] Int. Cl.$^7$ ................................................ H01L 21/425
[52] U.S. Cl. ......................... 438/528; 438/398; 438/255; 438/947
[58] Field of Search ................................... 438/445, 279, 438/17, 151, 299, 398, 528, 255, 444, 766, 744, 947; 156/612; 117/94; 148/1.5

[56] References Cited

U.S. PATENT DOCUMENTS

| | | | |
|---|---|---|---|
| 5,814,549 | 9/1998 | Wu | 438/398 |
| 5,821,152 | 10/1998 | Han et al. | 438/255 |
| 5,960,295 | 9/1999 | Jen et al. | 438/398 |

OTHER PUBLICATIONS

A. Nakajima et al., Isolated Nanometer–size Si Dot Arrays Fabricated Using Electron–Beam Lithography, Reactive Ion Etching, and Wet Etching in $NH_4OH/H_2O_2/H_2O$, Dec. 15, 1994 pp. L 1796–L1798.

Perkins et al., Fabrication of nm wide trenches in si by vacuum scanning tunneling microscope lithography of an organosilane self–assembled film and reactive ion etching, Jan. 22, 1996, pp. 550–552.

*Primary Examiner*—Charles Bowers
*Assistant Examiner*—Victor Yevsikov
*Attorney, Agent, or Firm*—Cohen, Pontani, Lieberman & Pavane

[57] ABSTRACT

This invention relates to a method for manufacturing silicon nitride films on a silicon substrate through chemical reaction of a surface, and then manufacturing a silicon nanometer structure using the silicon nitride films under ultra high vacuum condition. A method for manufacturing silicon nano structures using silicon nitride film, includes the following steps: performing a cleaning process of the silicon surface and implanting nitrogen ions having low energy into the silicon substrate; performing first heat treatment of the silicon substrate having ions implanted therin, and cooling the silicon substrate to room temperature to form monolayer thick silicon nitride islands; implanting oxygen gas on the silicon surface on which silicon nitride islands are used as masks while maintaining the surface of the silicon substrate at a temperature of 750 to 800° C. and forming silicon nano pillars by etching silicon portions selectively; and removing the silicon nitride islands by implanting reactive ions having energy of 100 to 200 eV on the surface of silicon nano pillars and performing second heat treatment at the temperature of 800 to 900° C.

4 Claims, 1 Drawing Sheet

METHOD FOR MANUFACTURING SILICON NANOMETER STRUCTURE USING SILICON NITRIDE FILM

BACKGROUND OF THE INVENTION

1. Field of the Invention

The present invention relates to a method for manufacturing silicon nanometer structures, more particularly, to a method in which a silicon nitride film is formed on a silicon substrate through chemical reaction of a surface, and then a silicon nanometer structure is formed using the silicon nitride film under a ultra high vacuum atmosphere.

2. Description of the Related Art

Nowadays, since miniaturization of semiconductor devices is needed for achieving semiconductor devices of large scale integration and ultra high speed, the technology of manufacturing semiconductor nano (nanometer) patterns, wires, pillars and dots comes is important. Therefore, it has become important to develop a technology for manufacturing nano structures having at low expenditure, high efficiency and high precision.

Patterns have been formed using an electron beam of high energy in the conventional nano structure manufacturing method. It takes a long time to form electron beam lithography patterns, and not only does this method cost much, but it also has a defect; there are many impurities on the surface.

SUMMARY OF THE INVENTION

Therefore, an object of the invention is to form nanometer size silicon nitride islands using surface chemical reaction and then to form silicon nano pillars using the nanometer size silicon nitride islands as masks for the oxygen under air ultra high vacuum condition. So, it is possible to perform the process with a little expenditure within a short time.

Another object of the invention is to control the size and density of the silicon nitride islands by changing the quantity of the nitrogen ion and the surface temperature. Then to produce silicon nano structures having ultra high purity due to the ultra high vacuum condition that the process is performed under.

A method of this invention includes the steps of performing a silicon sample cleaning process and implanting nitrogen ions having low energy into the silicon substrate; performing first annealing of silicon substrate having ions implanted, therein and cooling the silicon substrate to room temperature to form monolayer thick silicon nitride islands; implanting oxygen gas on the silicon surface, on which silicon nitride islands are used as masks while maintaining the surface of silicon substrate at the temperature of 750 to 800° C. and forming silicon nano pillars by etching silicon portion selectively; and removing the silicon nitride islands by implanting reactive ions having energy of 100 to 200 eV on the surface of silicon nano pillars and performing second heat treatment at a temperature of 800 to 900° C.

The above and further objects, aspects and novel features of the invention will become more apparent from the following detailed description when read in connection with the accompanied drawings.

BRIEF DESCRIPTION OF THE DRAWINGS

For better understanding of the nature and object of the invention, reference should be made to the following detailed description taken in conjunction with the accompanying drawings in which.

DESCRIPTION OF THE PREFERRED EMBODIMENT

The present invention is to be explained specifically hereinafter with reference to the attached drawings.

Figure 1A:
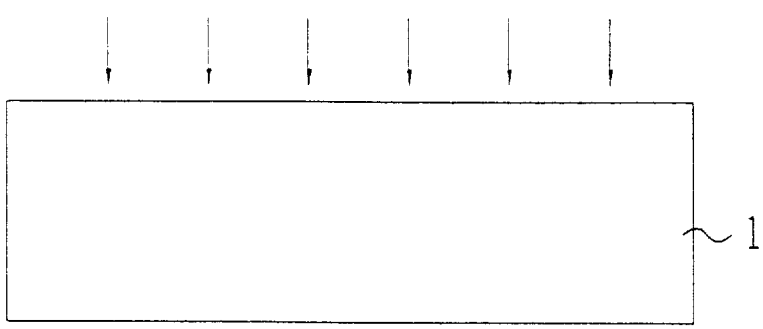
FIGS. 1a to 1d show side views in which silicon pillars having nanometer size are formed on a silicon substrate using surface chemical reaction.

FIG. 1a shows a side view in which the ion implantation is performed on the silicon substrate 1. A cleaning process of the silicon surface is performed at the level of atoms under an ultra high vacuum atmosphere. After producing a nitrogen ion beam of low energy using an ion gun, the nitrogen ions are implanted on the silicon substrate 1. Here, the cleaning process is performed by repeating the procedure of heating the substrate 1 at the temperature of 1200 to 1230° C. for several tens of seconds and cooling the substrate 1 to room temperature gradually. The nitrogen ions of 100 eV are implanted at room temperature in the ion implantation process.

Figure 1B:
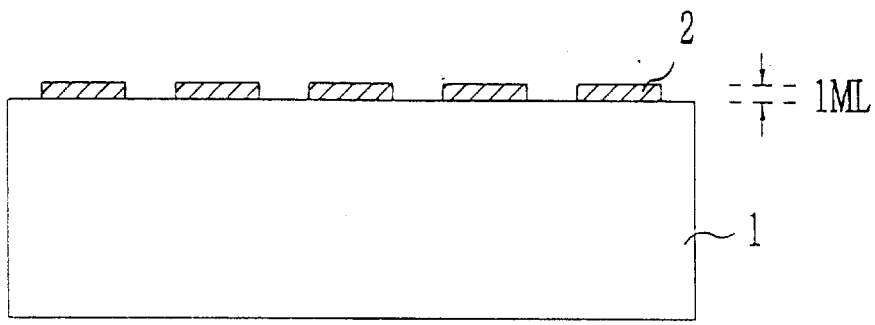

FIG. 1b shows a side view in which monolayer thick silicon nitride islands 2 with nm size are produced on the substrate 1. The monolayer thick silicon nitride ($Si_3N_4$) islands 2 with sizes of several nm to several tens of nm are produced by heating ion implanted silicon substrate 1 at the temperature of 950 to 980° C. for several minutes and cooling it. The surface density and size of silicon nitride islands 2 can be controlled in accordance with the quantity of nitrogen ions and the temperature of the surface. The silicon nitride islands 2 produced by this method are used as masks for the oxygen in the following process.

Figure 1C:
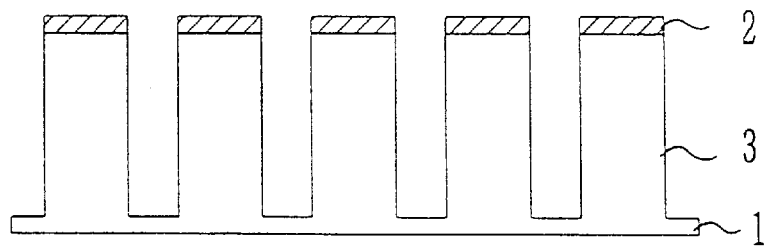

FIG. 1c shows a side view in which the nano pillars 3 are formed using selective etching of silicon by oxygen gas. The nano pillars 3 are formed by implanting oxygen gas into the silicon substrate 1 having silicon nitride islands 2 while maintaining the surface of silicon substrate 1 at a temperature of 750 to 800° C., and etching only silicon portions selectively. The oxygen gas is implanted at the pressure of $1 \times 10^{-7}$ to $1 \times 10^{-6}$ torr so that the etching reaction does not occur on the portions of silicon nitride but occur on the silicon surface selectively ($Si(s) + 1/2\ O_2(g) \rightarrow SiO(g)\uparrow$). Therefore, the pillars having the same height as that of etched silicon are formed.

Figure 1D:
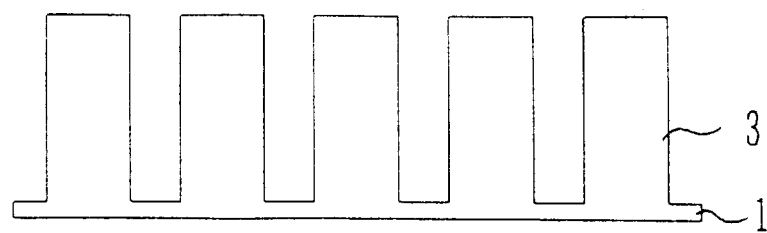

FIG. 1d shows a side view in which the silicon nitride islands 3 which were used as masks covering the silicon nano pillars 3 were removed. The silicon nitride films 2 covering silicon nano pillars 3 are removed by implanting highly reactive ions $CF_4^+$ having 100 to 200 eV energy onto the surface of silicon nano pillars. Then, the surface of the silicon which has atomic damages is recovered using the heat treatment at the temperature of 800 to 900° C. Here, the silicon nitride films can be removed easily since the etching speed of silicon nitride is relatively faster than that of silicon and the thickness of the films is only a monolayer.

The invention relates to the semiconductor device production field in which silicon nano pillars are formed using surface chemical reactions when manufacturing semiconductor devices of nanometer level. The process can be performed in a short time and with little expenditure. Also, it is possible to control the size and density of silicon nitride islands by changing the quantity of nitrogen ions and the temperature of the substrate surface. It is possible to manufacture a silicon nano structure having an ultra high purity since all processes are performed under ultra high vacuum atmosphere.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expendient variations that may be made within the scope and spirit of the present invention are to be encompassed as further embodiments of the present invention.

What is claimed is:

1. A method for manufacturing silicon nano structures using silicon nitride film, comprising the steps of:

performing a cleaning process of a silicon substrate having a surface and implanting nitrogen ions having low energy into the silicon substrate;

performing a first annealing process of the silicon substrate having the ions implanted, and cooling the silicon substrate to room temperature to form monolayer thick silicon nitride islands;

implanting oxygen gas at a pressure on the silicon surface on which some silicon nitride islands are used as masks while maintaining the surface of the silicon substrate at a temperature of 750 to 800° C. and forming silicon nano pillars by etching silicon portions selectively; and removing the silicon nitride islands by implanting reactive ions having energy of 100 to 200 eV on the surface of the silicon nano pillars and performing a second heat treatment at the temperature of 800 to 900° C.

2. The method as claimed in claim 1, in which the nitrogen ions have energy of 100 eV and they are implanted into the silicon substrate at the room temperature, and then heat treatment is performed for the silicon substrate at the temperature of 950 to 980° C. for 8 to 10 minutes.

3. The method as claimed in claim 1, in which the temperature of the silicon is 750 to 800° C. and the pressure of the oxygen gas is $1\times10^{-7}$ to $1\times10^{-6}$ torr.

4. The method as claimed in claim 1, in which the reactive ions for removing the silicon nitride film are $CF_4^+$ and have low energy.

* * * * *